US010126385B2

(12) United States Patent
Kwon

(10) Patent No.: US 10,126,385 B2
(45) Date of Patent: Nov. 13, 2018

(54) MAGNETIC RESONANCE IMAGING APPARATUS

(71) Applicant: SAMSUNG ELECTRONICS CO., LTD., Suwon-si (KR)

(72) Inventor: Oh Soo Kwon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 574 days.

(21) Appl. No.: 14/828,024

(22) Filed: Aug. 17, 2015

(65) Prior Publication Data
US 2016/0103193 A1 Apr. 14, 2016

(30) Foreign Application Priority Data

Oct. 14, 2014 (KR) .................. 10-2014-0138571

(51) Int. Cl.
G01R 33/38 (2006.01)
G01R 33/3815 (2006.01)
H01F 6/04 (2006.01)
(52) U.S. Cl.
CPC ..... G01R 33/3804 (2013.01); G01R 33/3815 (2013.01); H01F 6/04 (2013.01)
(58) Field of Classification Search
CPC .. A61B 5/055; G01R 33/5608; G01R 33/543; G01R 33/385; G01R 33/5659
See application file for complete search history.

(56) References Cited

U.S. PATENT DOCUMENTS

| 5,304,972 | A | * | 4/1994 | Sato | ................... | F25D 3/10 335/216 |
| 5,307,037 | A | * | 4/1994 | Woods | ............... | G01R 33/3815 174/15.5 |
| 5,613,367 | A | * | 3/1997 | Chen | ................... | G01R 33/3815 62/295 |
| 5,884,489 | A | * | 3/1999 | Retz | ................... | G01R 33/3815 335/216 |
| 2007/0120631 | A1 | * | 5/2007 | Hobbs | ................... | G01R 33/28 335/216 |

FOREIGN PATENT DOCUMENTS

JP 2002345775 A 12/2002
JP 2004-33260 A 2/2004
(Continued)

OTHER PUBLICATIONS

Communication dated Mar. 9, 2016, issued by the Korean Intellectual Property Office in counterpart Korean Application No. 10-2014-0138571.
(Continued)

Primary Examiner — Walter L Lindsay, Jr.
Assistant Examiner — Frederick Wenderoth
(74) Attorney, Agent, or Firm — Sughrue Mion, PLLC

(57) ABSTRACT

A magnetic resonance imaging (MRI) apparatus includes a coil assembly including a superconductive magnet; and a helium container configured to accommodate a helium in a liquid state and the coil assembly. The helium container includes a partition wall configured to surround a portion of an outer circumference of the coil assembly, and the helium in the liquid state is accommodated in a first space formed between the partition wall and the coil assembly.

25 Claims, 10 Drawing Sheets

(56) References Cited

FOREIGN PATENT DOCUMENTS

| JP | 200552658 A | 3/2005 |
|---|---|---|
| JP | 200753241 A | 3/2007 |
| JP | 2007125384 A | 5/2007 |
| JP | 2007189082 A | 7/2007 |
| JP | 2013118228 A | 6/2013 |

OTHER PUBLICATIONS

Communication dated Mar. 21, 2016, issued by the European Patent Office in counterpart European Application No. 15183357.1.
Yuri Lvovsky et al., "Novel technologies and configurations of superconducting magnets for MRI", Superconductor Science and Technology, vol. 26 No. 9 Jul. 19, 2013, Total 71 page, XP 020249751.

* cited by examiner

MAGNETIC RESONANCE IMAGING APPARATUS

CROSS-REFERENCE TO RELATED APPLICATION

This application claims priority from Korean Patent Application No. 10-2014-0138571, filed on Oct. 14, 2014, in the Korean Intellectual Property Office, the disclosure of which is incorporated herein by reference in its entirety.

BACKGROUND

1. Field

Apparatuses and methods consistent with exemplary embodiments relate to magnetic resonance imaging using a superconductive magnet.

2. Description of the Related Art

A medical imaging apparatus provides images containing information related to a patient. The medical imaging apparatus includes, for example, an X-ray apparatus, an ultrasonic diagnostic apparatus, a computed tomography (CT) imaging apparatus, and a magnetic resonance imaging (MRI) apparatus.

Among the above-described apparatuses, the magnetic resonance imaging apparatus is configured to provide images of soft tissues with excellent contrast and a variety of diagnostic visual information while being relatively convenient with respect to controlling imaging conditions. Thus, the magnetic resonance imaging apparatus is widely used in a medical diagnostic field.

A magnetic resonance imaging (MRI) refers to an imaging technique using density and physicochemical characteristics of an atomic nucleus by generating a resonance of a hydrogen atomic nucleus at an inside of a human body by using magnetic fields, which are not harmful to the human body, and also by using a specific ionization of radio frequency (RF).

In detail, the magnetic resonance imaging apparatus is used to diagnose an internal region of a human body by supplying a certain frequency and energy and by converting the energy released from an atomic nucleus into signals while certain magnetic fields at the atomic nucleus are applied.

A proton of the atomic nucleus has a spin angular momentum and a magnetic dipole, and thus when a magnetic field is applied, the proton is aligned in a direction of the magnetic field and performs precession about the direction of the magnetic field. The magnetic resonance imaging apparatus is capable of obtaining cross-sectional images of a human body by using a nuclear magnetic resonance that is generated by a strong magnetic force from a superconductive electromagnetic apparatus included in the magnetic resonance imaging apparatus.

SUMMARY

One or more exemplary embodiments provide a magnetic resonance imaging (MRI) apparatus configured to efficiently cool a coil assembly and reduce an usage amount of helium.

In accordance with an aspect of an exemplary embodiment, a magnetic resonance imaging apparatus includes a coil assembly, a helium container and a partition wall. The coil assembly may be configured to move by use of a superconductive magnet. The helium container may allow the coil assembly to be accommodated therein, and also allow helium in a liquid state to be accommodated therein.

A partition wall may be provided as to surround at least a portion of an outer circumferential wall of the coil assembly at an inside the helium container. Helium in a liquid state may be accommodated at an inside space formed by the partition wall.

Helium in a liquid state may be accommodated at a lower space of the helium container positioned at an outer side of the partition wall.

The magnetic resonance imaging apparatus may further include a cooling apparatus to cool the helium in a liquid state at an inside the helium container.

The helium in a liquid state cooled by use of the cooling apparatus may be introduced to the inside space formed by the partition wall.

After the inside space of the partition wall is completely filled with the helium in a liquid state, helium in a liquid state being introduced to the inside space of the partition wall may be descended toward the lower space of the helium container.

A storage chamber may be further provided at an inside the helium container, and the helium in a liquid state cooled by use of the cooling apparatus may be introduced to the storage chamber.

The storage chamber may be connected to the inside space formed by the partition wall.

A plurality of coils included in the coil assembly may be connected by use of a connector.

The inside space of the helium container may be divided by use of a separation wall, to form an accommodation space at which the connector is positioned.

The accommodation space formed by use of the separation wall may be communicated with the inside space formed by the partition wall surrounding an outer side surface of the coil assembly.

A maximum height of the separation wall forming the accommodation space from a bottom surface of the helium container may be lower than a height of an end portion of the partition wall surrounding the outer side surface of the coil assembly.

The accommodation space may be provided by dividing a portion of the lower space of the helium container.

The accommodation space may be positioned at a lateral side of the inside space of the helium container.

The connector may be provided in a plurality of units, and the accommodation space may be provided corresponding in number to the number of the connectors.

Helium in a liquid state may be accommodated at an inside the accommodation space.

In accordance with an aspect of an exemplary embodiment, a magnetic resonance imaging apparatus includes a superconductive electromagnetic apparatus, a helium container, a cooling apparatus and a partition wall. The superconductive electromagnetic apparatus may be configured to move by use of a superconductive magnet. The helium container allows the superconductive magnet to be accommodated therein, and allows helium in a liquid state to cool the superconductive electromagnetic apparatus to be accommodated therein. The cooling apparatus may be configured to cool the helium in a liquid state at an inside the helium container. The partition wall may be configured to divide an inside space of the helium container and provided to surround a portion of an outer side surface of the superconductive electromagnetic apparatus. A portion of the helium in a liquid state may be accommodated in the inside space of the helium container at which the superconductive electromagnetic apparatus is positioned while the other portion of the helium in a liquid state is accommodated at a lower space of the helium container positioned at an outer side of the partition wall.

The helium in a liquid state cooled by use of the cooling apparatus may be introduced to the inside space formed by the partition wall.

At an inside the helium container, a storage chamber communicated with the inside space formed by the partition wall may be further provided.

The helium cooled by use of the cooling apparatus may be introduced to the inside space of the partition wall through the storage chamber.

The superconductive electromagnetic apparatus may include a plurality of coils, and the plurality of coils may be connected by use of a connector.

The inside space of the helium container may be further divided by a separation wall, and the connector may be accommodated at a space formed by use of the separation wall.

The inside space formed by the partition wall and the inside space formed by the separation wall may be communicated with each other.

In accordance with an aspect an exemplary embodiment, a magnetic resonance imaging apparatus includes a superconductive electromagnetic apparatus, a helium container, a cooling apparatus and a partition wall. The superconductive electromagnetic apparatus may be configured to move by use of a superconductive magnet. The helium container may allow the superconductive electromagnetic apparatus to be accommodated therein. The cooling apparatus may be configured to cool helium in a liquid state at an inside the helium container. The partition wall may be configured to divide an inside space of the helium container as to surround a portion of an outer side surface of the superconductive electromagnetic apparatus, wherein the helium in a liquid state cooled by the cooling apparatus may be introduced to the inside the partition wall.

The superconductive electromagnetic apparatus may include a connector to which a plurality of coils is connected, and the connector may be accommodated at an accommodation space formed by a separation wall provided at an inside the helium container.

The accommodation space may be communicated with the inside the partition wall such that the helium in a liquid state is accommodated in the accommodation space.

BRIEF DESCRIPTION OF THE DRAWINGS

The above and/or other aspects will become more apparent by describing certain exemplary embodiments with reference to the accompanying drawings.

DETAILED DESCRIPTION

Figure 1:
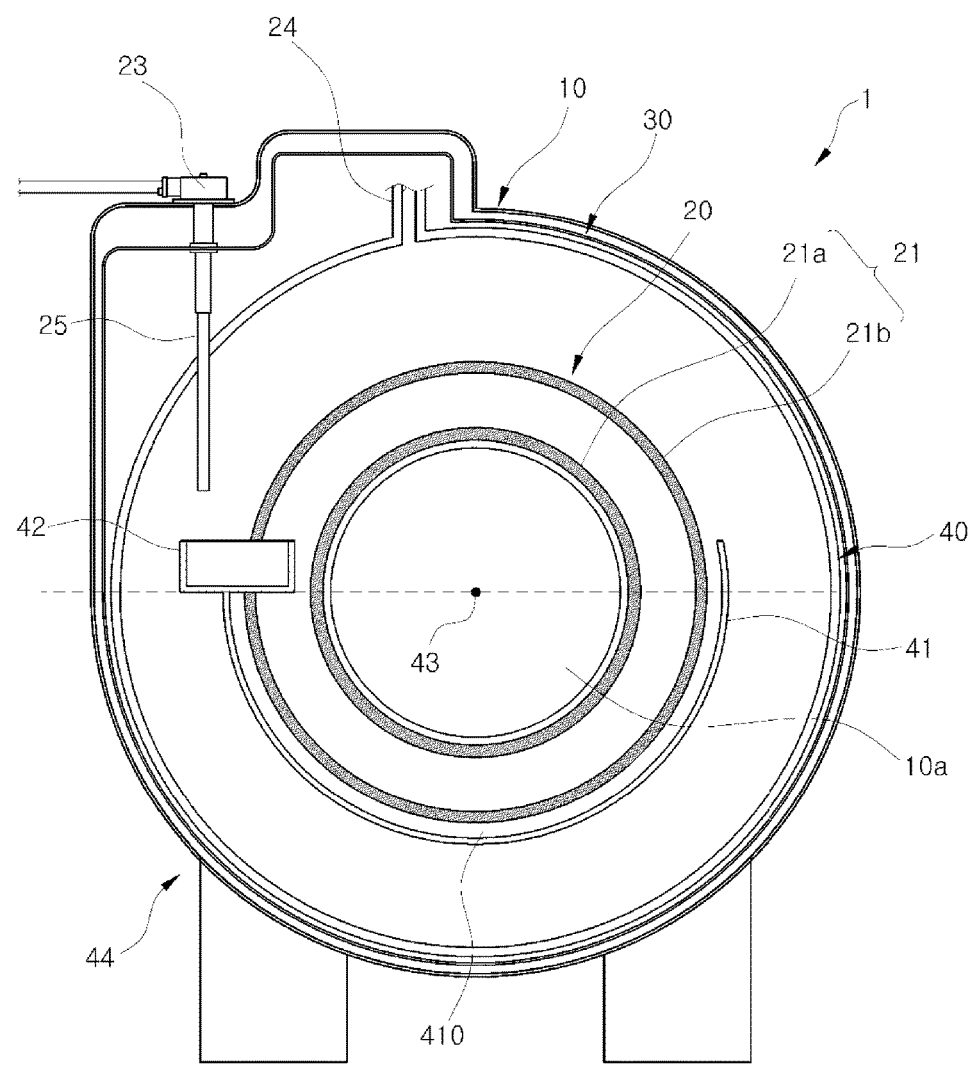
FIG. 1 is a schematic view of a magnetic resonance imaging (MRI) apparatus in accordance with an exemplary embodiment.

Reference will now be made in detail to exemplary embodiments with reference to the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description.

FIG. 1 is a schematic view of a magnetic resonance imaging (MRI) apparatus in accordance with an exemplary embodiment.

Referring to FIG. 1, a magnetic resonance imaging apparatus 1 includes a housing 10, a superconductive electromagnetic apparatus 20, a vacuum container 30, and a helium container 40. The housing 10 may form an exterior appearance of the magnetic resonance imaging apparatus 1, and the superconductive electromagnetic apparatus 20, the vacuum container 30, and the helium container 40 may be provided at an inside of the housing 10.

The superconductive electromagnetic apparatus 20 generates a strong magnetic force in a cryogenic state when a current is applied. The superconductive electromagnetic apparatus 20 includes a coil assembly 21 configured to generate magnetic fields when supplied with a current, and is accommodated at the helium container 40. The superconductive electromagnetic apparatus 20 may further include a cryogenic cooling apparatus configured to cool helium so that the helium at an inside of the helium container maintains a cryogenic state, and a current supplying apparatus configured to supply a current to the coil assembly 21 and the cryogenic cooling apparatus.

The housing 10 may be provided in the shape of a ring having an opening 10a, i.e., a bore, formed at a center portion thereof. An object to be imaged may be moved through the opening 10a. A plurality of insulation layers may be disposed at an inner side surface of the housing 10 for insulation.

The superconductive electromagnetic apparatus 20 may be provided at an inside of the housing 10. The superconductive electromagnetic apparatus 20 may include the coil assembly 21. The coil assembly 21 includes a main coil 21a to move as a superconductive magnet by receiving a current from a current supplying apparatus, and a shield coil 21b positioned at an outer side of the main coil 21a. Magnetic fields are generated at the main coil 21a in a state of superconductivity as a current having a strong pulse continuously flows without loss by electric resistance. A current in a direction opposite to the direction of the current flowing through the main coil 21a flows through the shield coil 21b, and is provided to prevent leakage of the magnetic fields generated from the main coil 21a.

The superconductive electromagnetic apparatus 20 may be accommodated at an inside of the helium container 40. The helium container 40 may be provided in the shape of a ring, and helium in a liquid state may fill an inside thereof.

A cooling apparatus 23 and a connecting pipe 24 may be provided at one side of the helium container 40. The cooling apparatus 23 is provided to inlet helium to the inside of the helium container 40 after cooling the helium that is vaporized at the inside of the helium container 40. The helium vaporized at the inside of the helium container 40 may be outlet through the connecting pipe 24. As the vaporized helium is outlet through the connecting pipe 24, the inside pressure of the helium container 40 is prevented from reaching a predetermined pressure.

The helium in a liquid state that is cooled by the cooling apparatus 23 may be inlet to the helium container 40 through an inlet pipe 25, or another pipe.

A partition wall 41 to surround a portion of the superconductive electromagnetic apparatus 20 may be provided at a lower portion 44 of the inside of the helium container 40. The partition wall 41 may be provided to surround a portion of the superconductive electromagnetic apparatus 20. Also, the partition wall 41 may be provided in a semicircular shape around a center 43 of the bore 10a of the magnetic resonance imaging apparatus 1. The partition wall 41 is positioned at the lower part in the magnetic resonance imaging apparatus 1.

At least a portion of the helium in a liquid state provided at the inside of the helium container 40 is accommodated at an inside space 410 formed by the partition wall 41, while another portion may be accommodated at an outside of the inside space 410 of the partition wall 41.

The vacuum container 30 may be provided at an outside of the helium container 40. The vacuum container 30, which has a vacuum state formed inside, is provided between the helium container 40 and the housing 10. The helium container 40 may be insulated by using the vacuum container 30.

Figure 2:
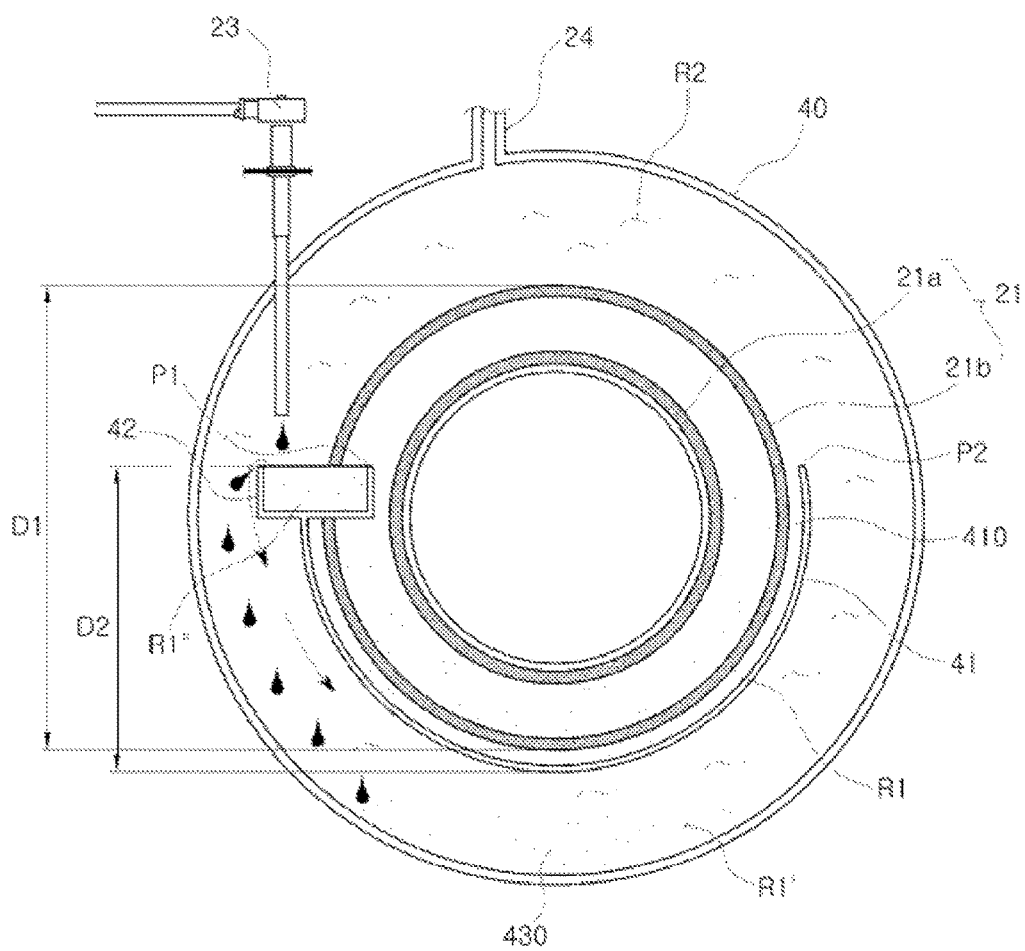
FIG. 2 is a view illustrating an inside of a helium container in accordance with an exemplary embodiment.

FIG. 2 is a view illustrating a helium container in accordance with an exemplary embodiment.

Referring to FIG. 2, the helium container 40 provided at the inside of the magnetic resonance imaging apparatus 1 in accordance with an exemplary embodiment may include the partition wall 41. The superconductive electromagnetic apparatus 20 is accommodated at the inside of the helium container 40, and the partition wall 41, a portion of which has a semicircular shape, may be positioned at a lower portion of the superconductive electromagnetic apparatus 20. The partition wall 41 may be spaced apart by a predetermined distance from the superconductive electromagnetic apparatus 20, and may be provided to surround a portion of an outer surface of the superconductive electromagnetic apparatus 20.

An area of the outer surface of the superconductive electromagnetic apparatus 20 surrounded by the partition wall 41 may vary according to an environment of the magnetic resonance imaging apparatus 1. For example, the partition wall 41 may be provided to surround the outer surface of the superconductive electromagnetic apparatus 20 by about 45% or more of the entire area of the outer surface of the superconductive electromagnetic apparatus 20. That is, when a diameter of a cross section of the superconductive electromagnetic apparatus 20 is D1, end portions P1 and P2 of the partition wall 41 may be positioned to form a semicircular shape having a diameter of D2, wherein D2 has a value corresponding to about 45% of a value of D1. In an exemplary embodiment, the left end portion P1 and the right end portion P2 of the partition wall 41 may be positioned to have identical heights of D2 with respect to a line 200 through a bottom 202 of the partition wall 41.

Helium R1, R1', and R1" in a liquid state may be accommodated at the inside of the helium container 40. The helium R1 in a liquid state may be accommodated at an inside space 410 formed by the partition wall 41, which surrounds at least a portion of the superconductive electromagnetic apparatus 20, and helium R1' in a liquid state may be at least partly accommodated at an outside space 430 of the partition wall 41.

Heat may be generated at the superconductive electromagnetic apparatus 20 by eddy currents when imaging by using the magnetic resonance imaging apparatus 1, and when the temperature of the superconductive electromagnetic apparatus 20 exceeds a predetermined temperature, the state of superconductivity of the superconductive electromagnetic apparatus 20 may be affected. Thus, at least a portion of the superconductive electromagnetic apparatus 20 may be cooled by using the helium R1 in a liquid state such that the superconductive electromagnetic apparatus 20 may maintain the state of superconductivity.

The helium R1' in a liquid state may be provided in addition to the helium R1 in a liquid state accommodated at the inside space 410 of the partition wall 41. The amount of the helium R1' to be added may be adjusted.

The heat generated from the superconductive electromagnetic apparatus 20 is delivered to the helium R1 in a liquid state accommodated at the inside space 410 of the partition wall 41, and the helium R1 in a liquid state may be vaporized by the delivered heat. Helium R2 in a vaporized state may be cooled by using the cooling apparatus 23 and phase-changed into a liquid state, and may be inlet to the inside space 410 of the partition wall 41. When the inside space 410 of the partition wall 41 is filled with the helium R1 in a liquid state, the helium in a liquid state that is introduced from the cooling apparatus 23 flows down toward a lower portion of the helium container 40 by overflowing from the partition wall 41.

A storage chamber 42 may be further provided at the inside of the helium container 40. The storage chamber 42 may be connected with the inside space 410 of the partition wall 41. The helium R1" in a liquid state cooled by the cooling apparatus 23 is introduced to the storage chamber 42, and the helium R1" in a liquid state that is inlet to the storage chamber 42 may be inlet to the inside space 410 of the partition wall 41.

The helium R1" in a liquid state cooled by the cooling apparatus 23 is introduced to the storage chamber 42, and the helium R1" in a liquid state of the storage chamber 42 may be inlet to the inside space 410 of the partition wall 41. When an amount of the helium R1 or R1" in a liquid state accommodated at the inside space 410 of the partition wall 41 or the storage chamber 42 reach the maximum level, the helium in a liquid state that is introduced to the inside of the storage chamber 42 or the partition wall 41 is overflown from the storage chamber 42 or the partition wall 41, and flows toward a lower portion of the helium container 40.

By providing the storage chamber 42, when the helium R1 in a liquid state is vaporized by the heat generated from the superconductive electromagnetic apparatus 20 such that the level of the helium R1 in a liquid state is lowered, the helium R1" in a liquid state accommodated at the storage chamber 42 may be promptly provided to the inside space 410 of the partition wall 41.

In a case where the storage chamber 42 is not provided, when the level of the helium R1 in a liquid state in the inside space 410 of the partition wall 41 is lowered as the helium R1 in a liquid state at the inside space 410 of the partition wall 41 is vaporized, the helium in a liquid state might not be promptly provided to the inside space 410 of the partition wall 41 during cooling of the helium R2 in a vaporized state by the cooling apparatus 23. According to an exemplary embodiment, by providing the storage chamber 42 connected with the inside space 410 of the partition wall 41, the helium in a liquid state accommodated at the storage chamber 42 may be promptly provided to the inside space 410 of the partition wall 41, so that the level of the helium R1 in a liquid state at the inside space 410 of the partition wall 41 may be prevented from being reduced.

Figure 3:
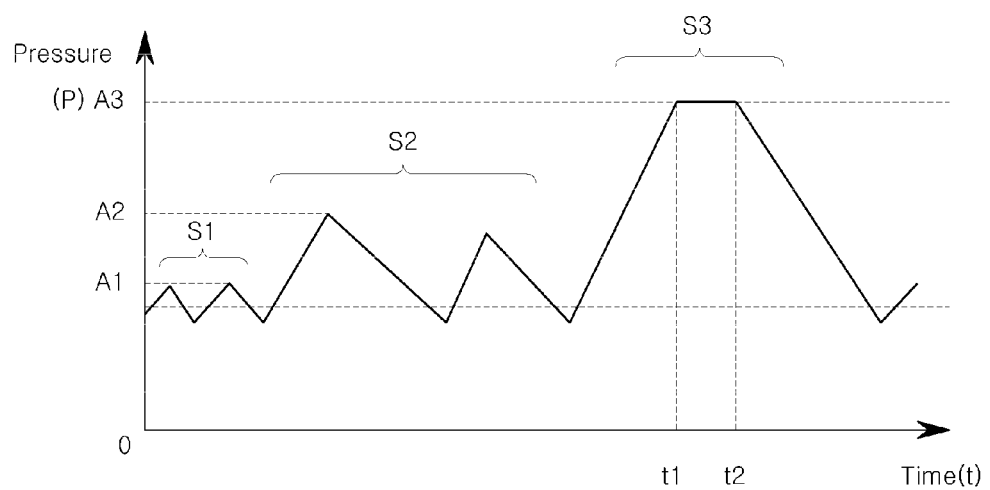
FIG. 3 is a graph illustrating a pressure change at an inside of a helium container in accordance with an exemplary embodiment.

FIG. 3 is a graph illustrating a pressure change at the inside of the helium container in accordance with an exemplary embodiment.

In FIG. 3, the helium in a liquid state and the helium in a vaporized state are both present at the inside of the helium container 40 in accordance with an exemplary embodiment. The helium in a liquid state is accommodated at the inside space 410 of the partition wall 41, at the storage chamber 42, and at a lower space 39 of the helium container 40, and the helium in a vaporized state may be accommodated at an upper space 45 of the helium container 40.

In a case of a standby state in which imaging by the magnetic resonance imaging apparatus 1 is not being performed (S1), the pressure at the inside of the helium container 40 may be maintained approximately within a level of A1. In a case in which imaging by the magnetic resonance imaging apparatus 1 is being performed (S2), heat is generated at the superconductive electromagnetic apparatus 20 and the helium in a liquid state may be vaporized.

When the helium in a liquid state is vaporized, the pressure at the inside of the helium container 40 may be increased above the level of A1. The helium in a vaporized state is cooled by the cooling apparatus 23, and the helium in a liquid state that is cooled may be inlet to the inside of the partition wall 41 through the storage chamber 42. The level of the helium in a liquid state at the inside space 410 of the partition wall 41 is maintained to cool the superconductive electromagnetic apparatus 20.

At the time when imaging by the magnetic resonance imaging apparatus 1 is performed, the pressure at the inside space 410 of the helium container 40 may be increased to be higher than the level of A1, which is the pressure in the standby state. In a case where imaging by the magnetic resonance imaging apparatus 1 is performed and cooling of the helium R2 in a vaporized state is normally performed by the cooling apparatus 23, the maximum pressure of the helium container 40 may be a level of A2.

In a case where imaging by the magnetic resonance imaging apparatus 1 is continuously performed or cooling of the helium in a vaporized state by the cooling apparatus 23 is not normally performed due to, for example, a defect in the cooling apparatus 23 (S3), the pressure at the inside of the helium container 40 may be increased above the level of A2. The pressure at the inside of the helium container 40 may be controlled to be lower than the level of A3, which is the maximum allowable pressure so that the helium container 40 may be prevented from being damaged. The maximum allowable pressure A3 may be set differently according to the environment of the helium container 40.

When the pressure at the inside of the helium container 40 reaches the level of A3, the connecting pipe 24 is opened, and the helium in a vaporized state may be released to an outside through the connecting pipe 24. The connecting pipe 24 may remain closed by using a check valve (not shown), and when the pressure of the inside of the helium container 40 reaches the level of A3, the check valve is opened and the helium in a vaporized state may be outlet through the connecting pipe 24. In a case where imaging by the magnetic resonance imaging apparatus 1 is stopped or cooling of the helium in a vaporized state by the cooling apparatus 23 becomes normal, the connecting pipe 24 may be closed. When the connecting pipe 24 is closed, the helium in a vaporized state is cooled by the cooling apparatus 23, and the pressure at the inside of the helium container 40 is decreased to approximately maintain the level of A1 in the standby state.

According to an exemplary embodiment, by dividing the lower space of the helium container 40 by using the partition wall 41 so that the helium in a liquid state is accommodated at the inside space 410 of the partition wall 41 and the remaining helium in a liquid state is accommodated at the lower space of the helium container 40, the ratio of the space that is taken by the helium in a liquid state at the inside of the helium container 40 may be largely reduced when compared to the related art. Thus, the usage amount of helium may be reduced when compared to the related art.

The space that may be occupied by the helium in a vaporized state may be considered as being increased as much as the space that is occupied by the helium in a liquid state in the helium container 40 is reduced. Since the space that may be occupied by the helium in a vaporized state is increased, an increased amount of the helium in a vaporized state may further be accommodated within the helium container 40, and thus the time taken for the inside pressure of the helium container 40 to reach the allowable pressure level of A3 by the helium in a vaporized state may increase. As the time taken for the inside pressure of the helium container 40 to reach the allowable pressure level of A3 by using the helium in a vaporized state increases, the interval at which the connecting pipe 24 is opened increases, and thus the amount of the helium in a vaporized state being released to an outside of the helium container 40 through the connecting pipe 24 may be reduced when compared to a related art. By reducing the amount of the helium in a vaporized state being released to an outside of the helium container 40, the amount of the helium in a liquid state to be inlet to the helium container 40 in the magnetic resonance imaging apparatus 1 may be reduced.

If the volume of the helium container 40 is reduced, the usage amount of the helium in a liquid state may be reduced. However, since a storage space of the helium in a vaporized state, which is provided to function as a buffer, is reduced as well, the amount of the helium in a liquid state being released through the connecting pipe 24 may be increased. However, according to an exemplary embodiment, by increasing the storage space of the helium in a vaporized state while reducing the usage amount of the helium in a liquid state, the initial amount of the helium being introduced to the helium container 40 is reduced and also the amount of the helium in a vaporized state being released during the use of the magnetic resonance imaging apparatus 1 is reduced. Accordingly, the amount of usage of the helium to be replenished during the use of the magnetic resonance imaging apparatus 1 may also be reduced.

As described above, in accordance with an exemplary embodiment, the usage amount of helium may be effectively reduced, and thus the manufacturing cost and the costs for operating the magnetic resonance imaging apparatus 1 may be reduced.

Figure 4A:
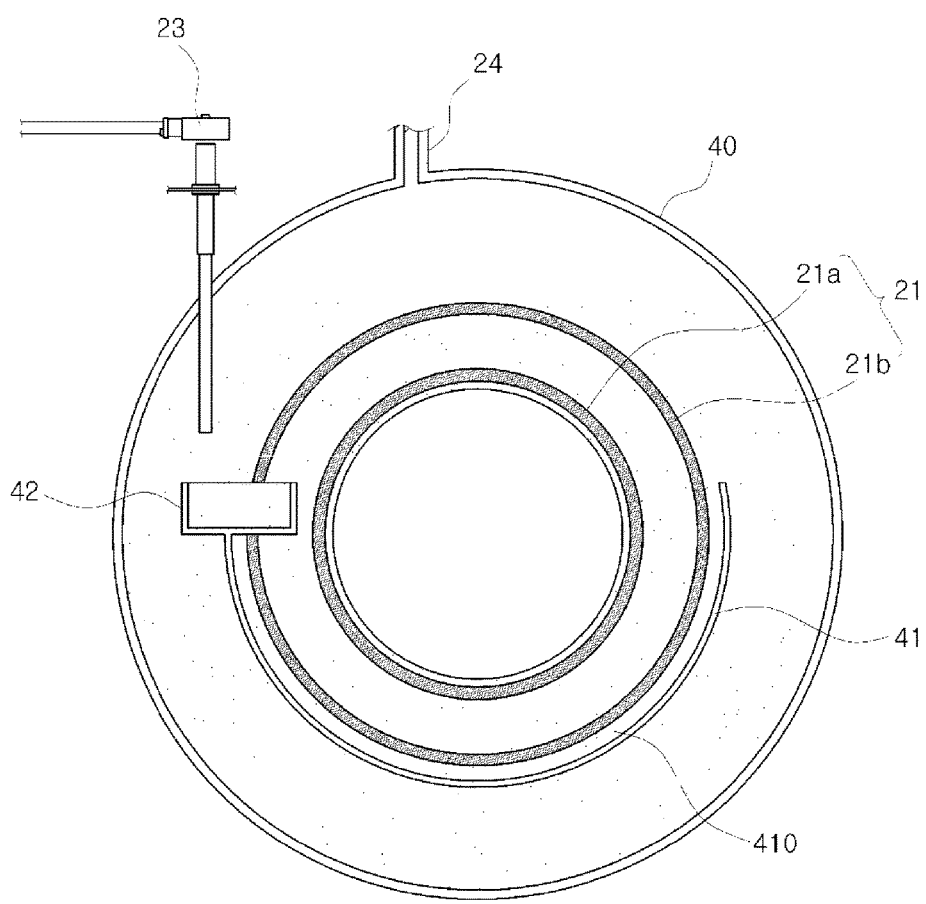
FIG. 4A, 4B, and FIG. 4C are views illustrating a usage state of a helium container in accordance with an exemplary embodiment.
Figure 4B:
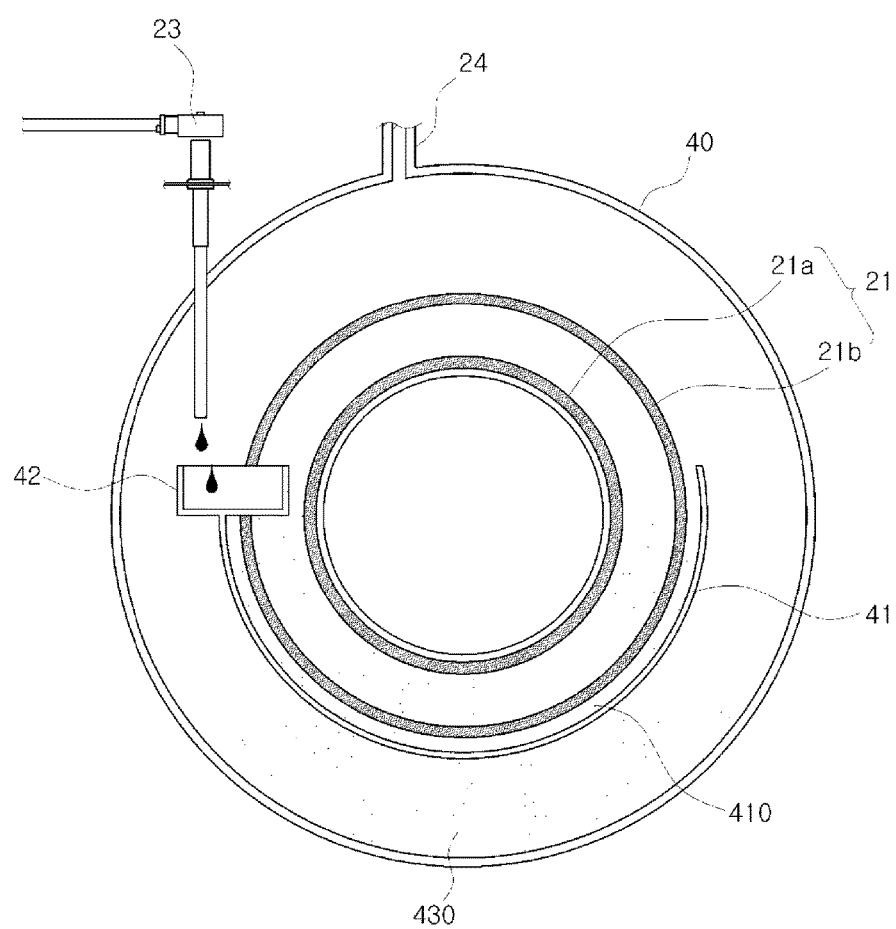
Figure 4C:
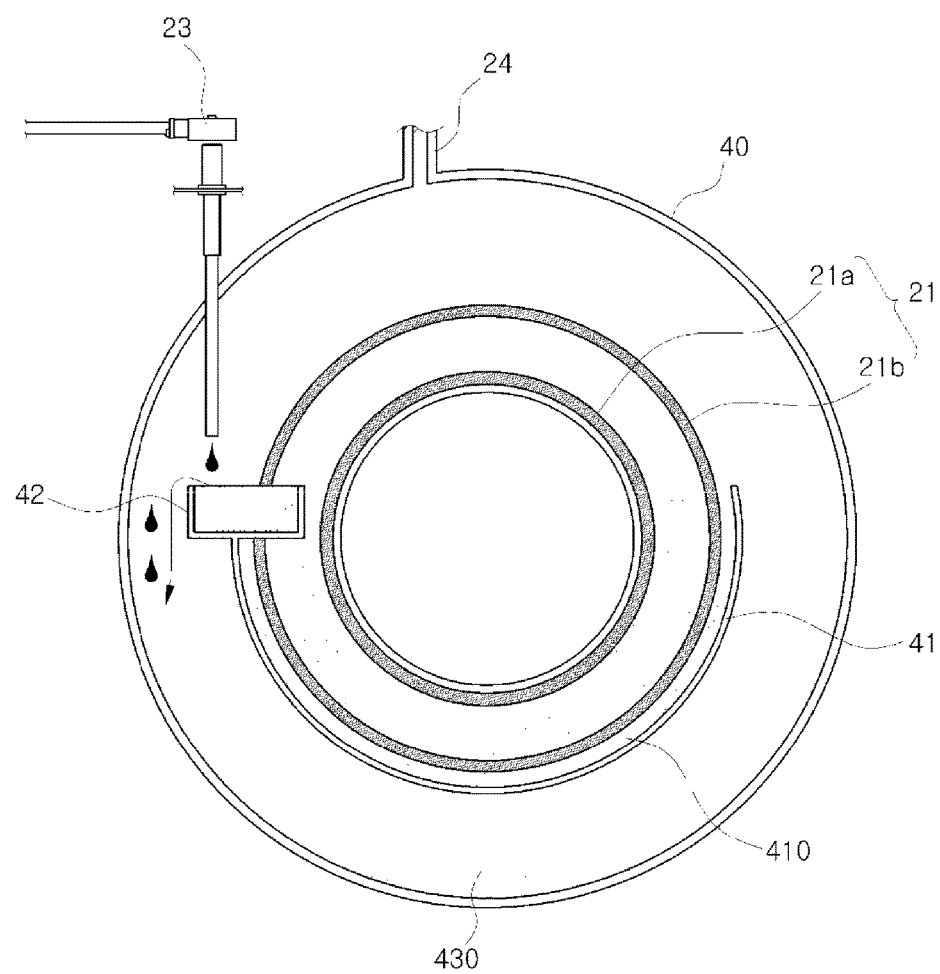

FIG. 4A, 4B, and FIG. 4C are views illustrating a usage state of the helium container in accordance with an exemplary embodiment.

Referring to FIG. 4A to FIG. 4C, the magnetic resonance imaging apparatus 1 in accordance with an exemplary embodiment may be manufactured and transported while being in a state that the helium in a liquid state fills the inside of the helium container 40 or in a state that an amount of the helium in a liquid state greater than needed during the use of the magnetic resonance imaging apparatus 1 fills the inside of the helium container 40 (FIG. 4A).

At the time of manufacturing the magnetic resonance imaging apparatus 1, the superconductive electromagnetic apparatus 20 is provided to flow a high current such that the magnetic resonance imaging apparatus 1 has superconductivity, and at the superconductive electromagnetic apparatus 20, heat may be generated by the high current. The superconductive electromagnetic apparatus 20 needs to maintain superconductivity at a lower temperature below a reference level. Thus, at the time of manufacturing the magnetic resonance imaging apparatus 1, an amount of the helium in a liquid state greater than needed for the time of usage of the magnetic resonance imaging apparatus 1 may be accommodated at the inside of the helium container 40. The amount of the helium in a liquid state needed for the superconductive electromagnetic apparatus 20 to have superconductivity may vary depending on products.

For example, the helium in a liquid state may fill substantially an entirety of the superconductive electromagnetic apparatus 20 provided at the inside of the helium container 40. At the time of when the magnetic resonance imaging apparatus 1 is manufactured and transported to a place to be installed, the cooling apparatus 23 of the magnetic resonance imaging apparatus 1 is not connected to a power, and thus the helium in a liquid state may be continually vaporized during the process of the transportation and released from the helium container 40.

After the transportation of the magnetic resonance imaging apparatus 1, the helium in a liquid state may be accommodated at the inside space 410 of the partition wall 41 and the outside space 430 (FIG. 4B). A portion of the helium in a liquid state is vaporized and exited from the helium container 40 during the transportation, and the remaining portion of the helium in a liquid state may be accommodated at the inside of the helium container 40. The space which was previously occupied by the portion of the helium in a liquid state that is vaporized and exited may be occupied by the helium in a vaporized state. A portion of the helium in a liquid state is accommodated at the inside of the partition wall 41, and the remaining portion of the helium in a liquid state may remain accommodated at a lower space of the helium container 40. After the transportation of the magnetic resonance imaging apparatus 1, the inside space 410 of the partition wall 41 might not be entirely filled with the helium in a liquid state.

In a state of FIG. 4B, when the cooling apparatus 23 is driven, the helium in a vaporized state is cooled and may be inlet to the inside of the partition wall 41 through the storage chamber 42. The helium in a vaporized state at the inside of the helium container 40 is cooled by the cooling apparatus 23, and is introduced only into the inside space 410 of the partition wall 41 until filling the entirety of the inside space 410 of the partition wall 41, and thus the amount of the helium in a liquid state accommodated at the outside space 430 of the partition wall 41 may be gradually reduced. As illustrated on FIG. 4C, when the inside space 410 of the partition wall 41 is entirely filled with the helium in a liquid state, the helium in a liquid state inlet from the cooling apparatus 23 may be provided to a lower space of the helium container 40, i.e., the outside space 430 of the partition wall 41. As described above, a portion of the helium in a liquid state fills the entirety of the inside space 410 of the partition wall 41, and the remaining portion of the helium in a liquid state may be accommodated at the storage chamber 42 and at the lower space of the helium container 40.

When the inside pressure of the helium container 40 reaches the maximum allowable level by using the magnetic resonance imaging apparatus 1, the helium in a vaporized state may be released to an outside the helium container 40 through the connecting pipe 23. Thus, the amount of the helium in a liquid state at the inside of the helium container 40 may be gradually reduced. At this time, the amount of the helium in a liquid state at the inside space 410 of the partition wall 41 may be maintained, and the amount of the helium in a liquid state accommodated at the lower space of the helium container 40 may be reduced. The helium in a vaporized state is cooled by the cooling apparatus 23 and is introduced to the inside of the partition wall 41 through the storage chamber 42, and thus the state of the inside space 410 of the partition wall 41 being entirely filled with the helium in a liquid state may be maintained. However, as much as the amount of the helium in a vaporized state released to an outside, the helium in a liquid state accommodated at the lower space of the helium container 40 may be reduced.

When the helium in a liquid state accommodated at the lower space of the helium container 40 is entirely exhausted, the level of the helium in a liquid state at the inside space 410 of the partition wall 41 may also be lowered. When the level of the helium in a liquid state at the inside space 410 of the partition wall 41 is lowered, the cooling by the superconductive electromagnetic apparatus 20 might not be efficiently performed. Thus, the helium in a liquid state needs to be inlet to the inside of the helium container 40. In a case where the helium in a liquid state accommodated at the lower space of the helium container 40 is exhausted or in a case where the level of the helium in a liquid state at the inside space 410 of the partition wall 41 is reduced below the level needed to cool the superconductive electromagnetic apparatus 20, a user may inlet the helium in a liquid state into the inside of the helium container 40. For example, when about 50% of the superconductive electromagnetic apparatus 20 and/or the helium container 40 is filled with the helium in a liquid state accommodated at the inside of the partition wall 41, a user may inlet the helium in a liquid state into the inside of the helium container 40.

Figure 5:
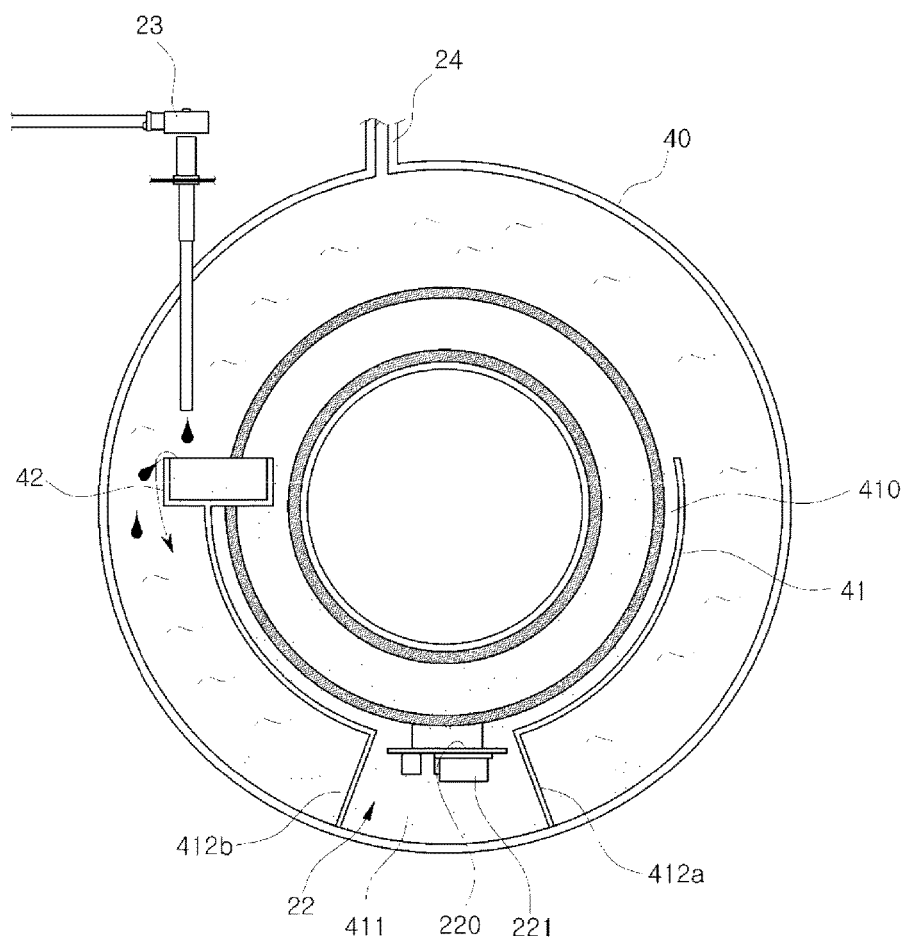
FIG. 5 is a view illustrating an inside of a helium container in accordance with an exemplary embodiment.
Figure 6:
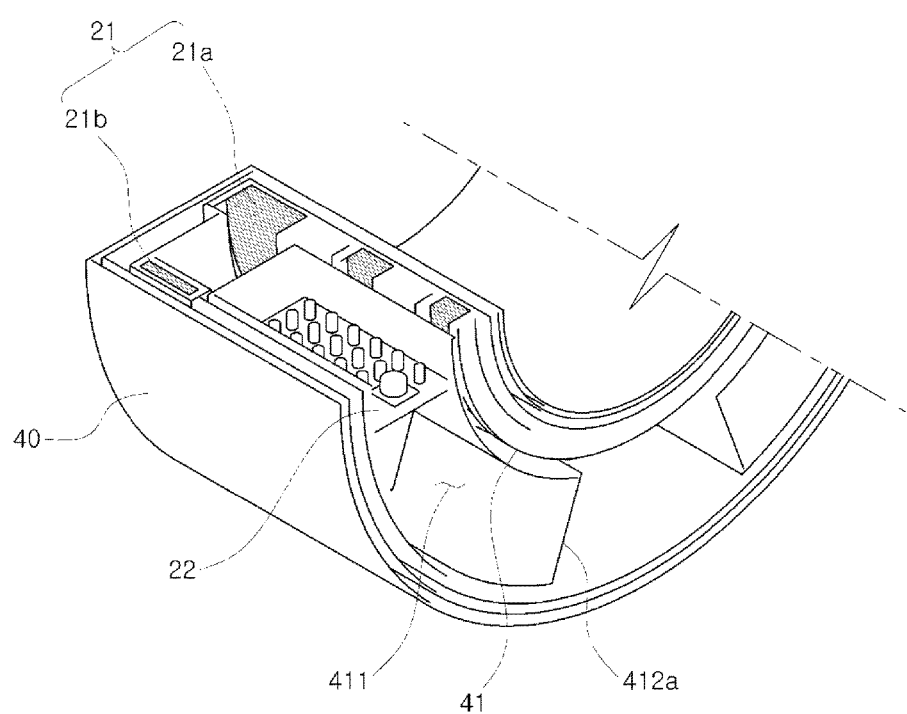
FIG. 6 is a view illustrating a portion of a helium container in accordance with an exemplary embodiment.

FIG. 5 is a view illustrating an inside of a helium container in accordance with another exemplary embodiment, and FIG. 6 is a view illustrating a portion of a helium container in accordance with another exemplary embodiment.

Referring to FIG. 5 and FIG. 6, the superconductive electromagnetic apparatus 20 in accordance with another exemplary embodiment may include a connector 22. The connector 22 is positioned at an accommodation space 411, at which helium in a liquid state is accommodated, at an inside of the helium container 40. The connector 22 may be cooled by the helium in a liquid state at the inside of the accommodation space 411.

The superconductive electromagnetic apparatus 20 may include a plurality of coils, and the plurality of coils may be connected by using the connector 22. The connector 22 may include a connection plate 220 and a plurality of connection cups 221 provided at one surface of the connection plate 220. The plurality of coils are inserted into the connection cup 221, and an inside of the connection cup 221 may be filled with a metallic material that is identical with that of the coils. Thus, the plurality of coils provided at the superconductive electromagnetic apparatus 20 may be connected through the connector 22. In a case where the plurality of coils are connected through the connector 22, an electric resistance may be avoided at a portion at which the coils are connected to each other.

The connector 22 refers to a portion at which the plurality of coils are connected, and when temperature is increased, an electric resistance may occur at the connector 22. Therefore, to prevent superconductivity of the superconductive electromagnetic apparatus 20 from being affected by the electric resistance occurring at the superconductive electromagnetic apparatus 20, the connector 22 needs to be maintained in a state of being cooled by the helium in a liquid state.

The accommodation space 411 at which the connector 22 is positioned is provided at the inside of the helium container 40, and the accommodation space 411 may be provided to form a single space while connected with respect to the inside space 410 of the partition wall 41, and the coil assembly 21 of the superconductive electromagnetic apparatus 20 is positioned in the accommodation space 411. The accommodation space 411 may be provided by dividing a portion of a lower space at the inside of the helium container 40 by using separation walls 412a and 412b. The separation walls 412a and 412b forming the accommodation space 411 may be provided while connected to the partition wall 41 formed to surround an outer circumferential surface of the coil assembly 21.

The accommodation space 411 at which the connector 22 is positioned may be provided at a lower portion of the inside of the helium container 40. Since the accommodation space 411 is provided at the lower portion of the inside of the helium container 40, in a case where the remaining amount of the helium in a liquid state at the inside of the helium container 40 is small, the state of the connector 22 being cooled may be maintained. Thus, the connector 22 may be prevented from not being properly cooled, and therefore, the state of superconductivity of the superconductive electromagnetic apparatus 20 may be prevented from being affected by an occurrence of a resistance at the superconductive electromagnetic apparatus 20.

At an outside of the separation walls 412a and 214b of the accommodation space 411, the helium in a liquid state in surplus is accommodated, and when vaporized, the surplus helium in a liquid state is cooled by the cooling apparatus 23 and may be inlet into the inside space 410 of the partition wall 41 and toward the accommodation space 411.

Figure 7:
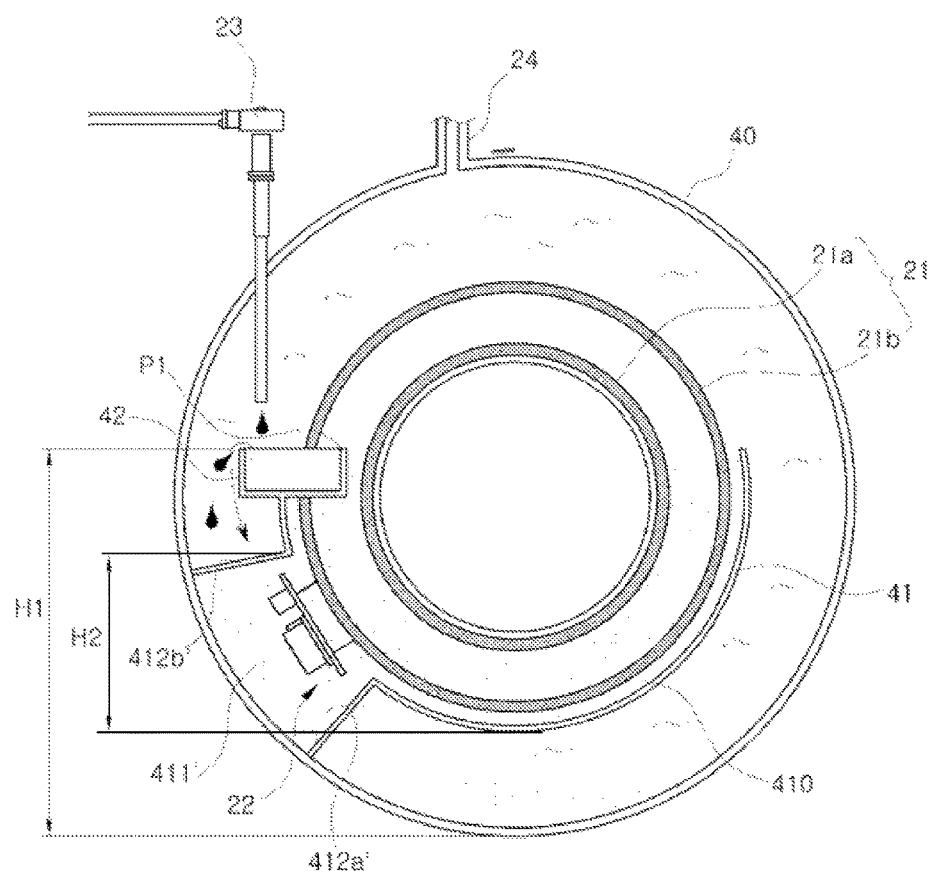
FIG. 7 is a view illustrating an inside of a helium container in accordance with an exemplary embodiment.

FIG. 7 is a view illustrating an inside of a helium container in accordance with still another exemplary embodiment.

Referring to FIG. 7, an accommodation space 411' at which the connector 22 is positioned may be provided at a side portion of the helium container 40. The accommodation space 411' at which the connector 22 is positioned may be connected to the inside space 410 of the partition wall 41 surrounding an outer circumferential surface of the coil assembly 21. The maximum height H1 of the separation walls 412a' and 412b' forming the accommodation space 411' with respect to a line 206 through a bottom 208 of the helium container 40 may be lower than the maximum height H2 of an end portion P1 of the partition wall 41 with respect to the bottom 208 of the helium container 40. Therefore, when the amount of the helium in a liquid state at the inside of the partition wall 41 is reduced, the helium in a liquid state may still be sufficiently accommodated at the inside of the accommodation space 411 at which the connector 22 is positioned.

Similar to the above described exemplary embodiments, the helium container 40 has a structure in which the helium in a liquid state cooled by the cooling apparatus 23 is introduced into the inside space 410 of the partition wall 41 and the accommodation space 411' formed by the separation walls 412a' and 412b', and when the helium in a liquid state is further inlet from the cooling apparatus 23 after entirely filling the inside space 410 and the accommodation space 411', the helium in a liquid state, which is further inlet, is accommodated at the lower space of the helium container 40.

Figure 8:
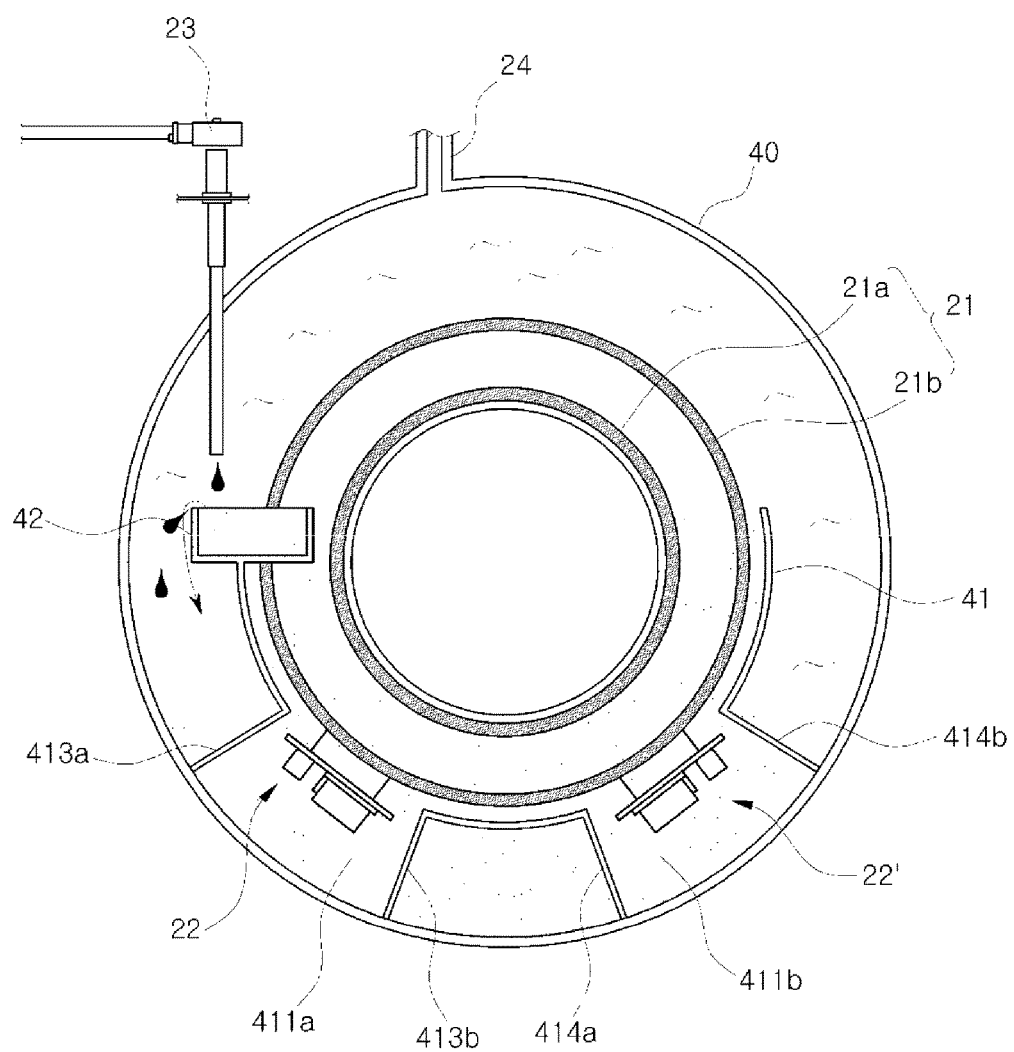
FIG. 8 is a view illustrating an inside of a helium container in accordance with an exemplary embodiment.

FIG. 8 is a view illustrating an inside of a helium container in accordance with still another exemplary embodiment.

Referring to FIG. 8, a plurality of connectors 22 and 22' are provided. A plurality of accommodation spaces 411a and 411b, at which the connectors 22 and 22' are respectively positioned, correspond with respect to the number of the connectors 22 and 22'. The accommodation spaces 411a and 411b formed by separation walls 413a, 413b, 414a, and 414b may be connected to the inside space 410 of the partition wall 41 surrounding an outer circumferential surface of the coil assembly 21.

Similar to the above described exemplary embodiments, the helium container 40 has a structure in which the helium in a liquid state cooled by the cooling apparatus 23 is introduced into the inside space 410 of the partition wall 41, and the accommodation spaces 411a and 411b of the separation walls 413a, 413b, 414a, and 414b, and when the helium in a liquid state is further inlet from the cooling apparatus 23 after entirely filling the inside space 410, and the accommodation spaces 411a and 411b, the helium in a liquid state, which is further inlet, is accommodated at the lower space of the helium container 40.

As described above, by dividing a space at an inside of the helium container by using the partition wall and by cooling the coil assembly by using the helium in a liquid state that is accommodated at the inside space of the partition wall, at which the coil assembly is positioned, the inlet amount of the helium in a liquid state may be reduced at the time of manufacturing of the magnetic resonance imaging apparatus 1. Also, by increasing the space at which the vaporized helium is accommodated, the frequency of releasing the helium in a vaporized state to an outside may be reduced, and thus the usage amount of the helium in a liquid state during use of the magnetic resonance imaging apparatus 1 may be reduced. In addition, by accommodating the surplus helium in a liquid state at an outside space of the partition wall, the helium in a liquid state may be stably supplied into the inside space of the partition wall. Accordingly, by reducing the usage amount of the helium in a liquid state, the manufacturing cost of the magnetic resonance imaging apparatus 1 may be reduced, and the state of the coil assembly and the connector being cooled may be stably maintained.

Therefore, according to the exemplary embodiments, by reducing the amount of helium stored at an inside of a helium container and/or the consumption amount of helium, the costs needed to manufacture and use an magnetic resonance imaging apparatus can be reduced.

The foregoing exemplary embodiments and advantages are merely exemplary and are not to be construed as limiting. The present teaching can be readily applied to other types of apparatuses. The description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus, comprising:
   a coil assembly comprising a superconductive magnet; and
   a helium container which is configured to accommodate the coil assembly and a helium, and which comprises a partition wall configured to surround a first portion of an outer circumference of the coil assembly, a second portion of the outer circumference of the coil assembly not being surrounded by the partition wall,
   wherein the helium in a liquid state is accommodated in a first space defined by the partition wall and the first portion of the outer circumference of the coil assembly.

2. The MRI apparatus of claim 1, wherein the helium in the liquid state is further accommodated in a second space disposed at a lower portion of the helium container outside the partition wall.

3. The MRI apparatus of claim 1, further comprising:
   a cooling apparatus configured to cool the helium in a vaporized state into the helium in the liquid state.

4. The MRI apparatus of claim 3, wherein the helium, which has been cooled by the cooling apparatus into the liquid state, is introduced to the first space.

5. The MRI apparatus of claim 4, wherein, in response to the first space being substantially filled with the helium in the liquid state, the helium in the liquid state flows from the first space down into a second space disposed at a lower portion of the helium container outside the partition wall.

6. The MRI apparatus of claim 3, wherein the helium container further comprises a storage chamber positioned inside the helium container, and
   the helium, which has been cooled by the cooling apparatus into the liquid state, is introduced to the storage chamber.

7. The MRI apparatus of claim 6, wherein the storage chamber is configured to be communicably connected to the first space.

8. The MRI apparatus of claim 1, wherein the coil assembly comprises coils, which are connected to each other by a connector.

9. The MRI apparatus of claim 8, wherein the helium container further comprises an accommodation space configured to house the connector, and
   the accommodation space is formed by separation walls which extend from the partition wall through a second space disposed at a lower portion of the helium container outside the partition wall.

10. The MRI apparatus of claim 9, wherein the accommodation space formed by the separation walls is communicably connected with the first space.

11. The MRI apparatus of claim 9, wherein a maximum height of the separation walls is less than a height of an end portion of the partition wall, with respect to a bottom of the helium container.

12. The MRI apparatus of claim 9, wherein the separation walls divide a portion of second space inside the helium container.

13. The MRI apparatus of claim 12, wherein the accommodation space is positioned at a lateral side of the first space of the helium container, with respect to a bottom of the helium container.

14. The MRI apparatus of claim 12, wherein the connector comprises connection elements, and
   the accommodation space comprises a number of accommodation spaces corresponding to a number of the connection elements.

15. The MRI apparatus of claim 9, further comprising:
    a cooling apparatus configured to cool the helium in a vaporized state into the helium in the liquid state,
    wherein the cooling apparatus is configured to provide the helium in the liquid state to the accommodation space.

16. A magnetic resonance imaging (MRI) apparatus comprising:
    a superconductive electromagnetic apparatus comprising a superconductive magnet;
    a helium container, which is configured to accommodate a helium and the superconductive electromagnetic apparatus, and comprises a partition wall configured to surround a first portion of an outer surface of the superconductive electromagnetic apparatus, a second portion of the outer surface of the superconductive electromagnetic apparatus not being surrounded by the partition wall; and
    a cooling apparatus configured to provide a first portion of the helium in a liquid state to a first space defined by the partition wall and the first portion of the outer surface of the superconductive electromagnetic apparatus, and a second portion of the helium in the liquid state to a second space of the helium container positioned at a lower portion of the helium container outside the first space.

17. The MRI apparatus of claim 16, wherein the cooling apparatus is configured to cool the helium in a vaporized state into the helium in the liquid state.

18. The MRI apparatus of claim 17, wherein the helium container further comprises a storage chamber configured to be communicably connected with the first space.

19. The MRI apparatus of claim 18, wherein the cooling apparatus is configured to provide the helium in the liquid state to the first space through the storage chamber.

20. The MRI apparatus of claim 16, wherein the superconductive electromagnetic apparatus comprises coils, which are connected to each other by a connector.

21. The MRI apparatus of claim 20, wherein the helium container further comprises an accommodation space configured to house the connector, and
    the accommodation space is formed by separation walls which extend from the partition wall through the second space.

22. The MRI apparatus of claim 21, wherein the first space and the accommodation space are communicably connected with each other.

23. A magnetic resonance imaging (MRI) apparatus, comprising:
    a superconductive electromagnetic apparatus comprising a superconductive magnet;
    a helium container configured to accommodate the superconductive electromagnetic apparatus;
    a cooling apparatus configured to provide a helium in a liquid state to the helium container; and
    a partition wall positioned within the helium container and configured to define a space within the helium container by surrounding a first portion of an outer surface of the superconductive electromagnetic apparatus, a second portion of the outer surface of the superconductive electromagnetic apparatus not being surrounded by the partition wall,
    wherein the cooling apparatus is configured to provide the helium in the liquid state to the space defined by the partition wall and the first portion of the outer surface of the superconductive electromagnetic apparatus.

24. The MRI apparatus of claim 23, wherein the superconductive electromagnetic apparatus comprises a connector to which coils of the superconductive electromagnetic apparatus are connected, and the connector is configured to be accommodated in an accommodation space, which is formed by separation walls provided at an inside of the helium container.

25. The MRI apparatus of claim 24, wherein the accommodation space is configured to be communicably connected with the space defined in the helium container such that the helium in the liquid state is accommodated in the accommodation space.

* * * * *